United States Patent
Shimizu et al.

(10) Patent No.: US 8,642,233 B2
(45) Date of Patent: Feb. 4, 2014

(54) METHOD OF MANUFACTURING COLOR FILTER SUBSTRATE FOR SEMITRANSMISSIVE TYPE LIQUID CRYSTAL DISPLAY DEVICE

(75) Inventors: Mie Shimizu, Tokyo (JP); Koichi Minato, Tokyo (JP); Takeshi Itoi, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 13/337,973

(22) Filed: Dec. 27, 2011

(65) Prior Publication Data

US 2012/0094221 A1    Apr. 19, 2012

Related U.S. Application Data

(63) Continuation of application No. 12/074,059, filed on Feb. 29, 2008, now abandoned, which is a continuation of application No. PCT/JP2006/316600, filed on Aug. 24, 2006.

(30) Foreign Application Priority Data

Aug. 29, 2005    (JP) .................................. 2005-247349

(51) Int. Cl.
G02F 1/335    (2006.01)
G02B 5/20    (2006.01)

(52) U.S. Cl.
USPC ............................................................ 430/7

(58) Field of Classification Search
None
See application file for complete search history.

(56) References Cited

U.S. PATENT DOCUMENTS

| | | | |
|---|---|---|---|
| 5,626,796 A | | 5/1997 | Tsujimura et al. |
| 2001/0030821 A1 | | 10/2001 | Enokido |
| 2003/0053012 A1 | * | 3/2003 | Ikeno et al. .................. 349/106 |
| 2004/0234872 A1 | | 11/2004 | Horiguchi |
| 2005/0043452 A1 | | 2/2005 | Araki |
| 2005/0250024 A1 | | 11/2005 | Fujimori |

FOREIGN PATENT DOCUMENTS

| | | |
|---|---|---|
| JP | 7-271020 | 10/1995 |
| JP | 2001-125094 | 5/2001 |
| JP | 2001-249213 | 9/2001 |
| JP | 2001-249216 | 9/2001 |
| JP | 2002-303717 | 10/2002 |
| JP | 2002-328365 | 11/2002 |

(Continued)

OTHER PUBLICATIONS

Computer-generated translation of JP 2005-107356 (Apr. 2005).*

(Continued)

*Primary Examiner* — John A. McPherson

(57) ABSTRACT

A method of a color filter substrate for a semitransmissive type liquid crystal display device, including: forming a photosensitive coloring composition layer containing a photopolymerizable monomer, a resinous binder, a polymerization initiator, a coloring agent and a solvent on a surface of a transparent substrate, the surface being partitioned into a large number of pixel regions; exposing the photosensitive coloring composition layer to light; and developing the photosensitive coloring composition layer to form a transmissive portion and a reflective portion, the transmissive portion being assigned to colorize a transmitted light from a light source arranged on a rear surface side of a liquid crystal display device, the reflective portion being assigned to colorize a reflected light to be derived from reflection of an external light entering from the observer's side and having a through-hole with a diameter of 10 μm or less.

6 Claims, 5 Drawing Sheets

(56) References Cited

FOREIGN PATENT DOCUMENTS

| JP | 2003-177517 | | 6/2003 |
|---|---|---|---|
| JP | 2005-107356 | * | 4/2005 |
| JP | 2005-187678 | | 7/2005 |
| JP | 2005-221803 | | 8/2005 |
| KR | 10-2005-0017596 | | 2/2005 |

OTHER PUBLICATIONS

International Search Report (PCT/ISA/210) mailed on Sep. 19, 2006 in connection with the International application PCT/JP2006/316600.

International Preliminary Report on Patentability, mailed Mar. 13, 2008 and issued in corresponding International Patent Application No. PCT/JP2006/316600.

Korean Office Action mailed Nov. 10, 2009 in corresponding Korean Patent Application 10-2008-7004787.

Ishikawa et al., General Review on Latest Polymer Materials and Technology; 37 (1998).

Taniguchi et al., Organic Electronics Materials, Science Forum; 15 (1986).

Office Action mailed from the Unites States Patent and Trademark Office on Sep. 27, 2008 in the related U.S. Appl. No. 12/074,059.

U.S. Appl. No. 12/074,059, filed Feb. 29, 2008, Mie Shimizu et al., Toppan Printing Co., Ltd.

* cited by examiner

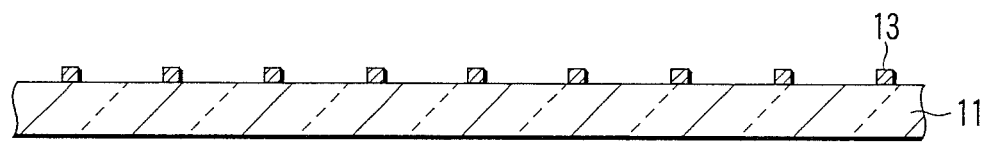
F I G. 5A
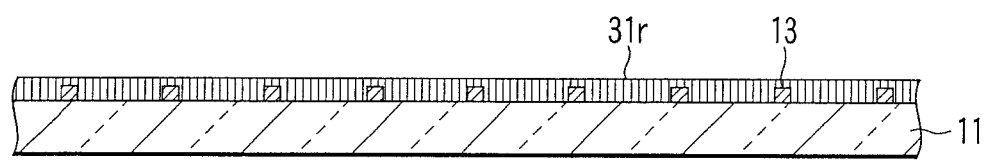
F I G. 5B
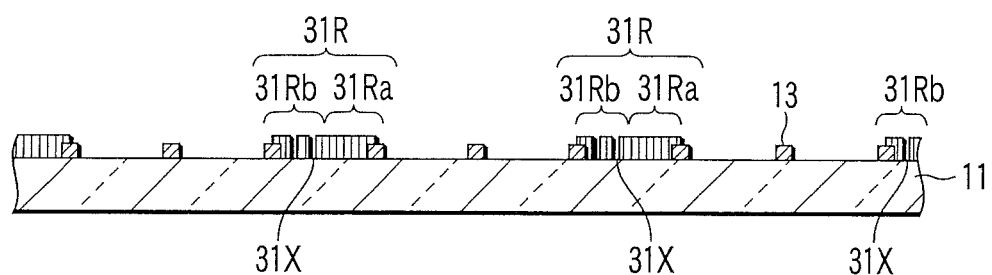
F I G. 5C

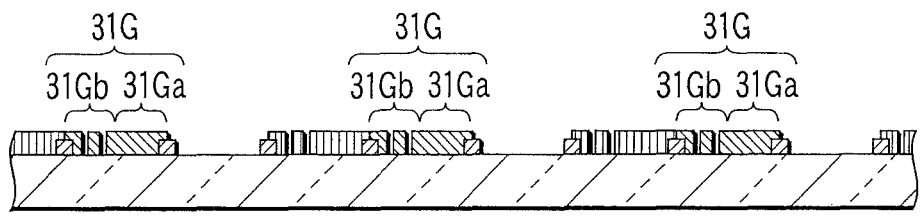
F I G. 5D
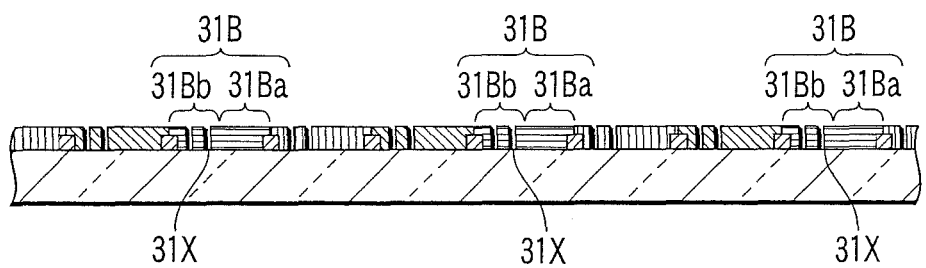
F I G. 5E
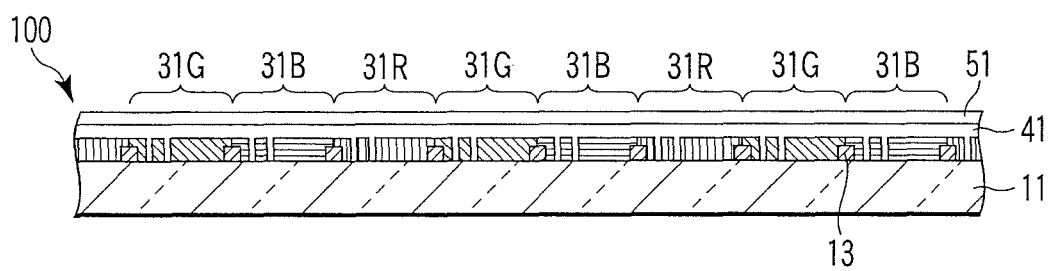
F I G. 5F

METHOD OF MANUFACTURING COLOR FILTER SUBSTRATE FOR SEMITRANSMISSIVE TYPE LIQUID CRYSTAL DISPLAY DEVICE

CROSS-REFERENCE TO RELATED APPLICATIONS

This application is a continuation of and claims priority benefit to U.S. patent application Ser. No. 12/074,059, filed Feb. 29, 2008 now abandoned, which U.S. application Ser. No. 12/074,059 was a continuation application and claims priority benefit to PCT Application No. PCT/JP2006/316600, filed Aug. 24, 2006, which application PCT/JP2006/316600 in turn was based upon and claims the benefit of priority from prior Japanese Patent Application No. 2005-247349, filed Aug. 29, 2005, the entire contents of which are incorporated herein by reference.

BACKGROUND

1. Field

The present invention relates to a photosensitive coloring composition, a color filter substrate produced by using this photosensitive coloring composition, and a liquid crystal display device provided with this color filter substrate. As for specific examples of the liquid crystal display device, they include a semitransmissive type liquid crystal display device which is capable of displaying images not only by means of transmitted light from a light source built into the display device but also by means of reflected light to be obtained from the reflection of external light such as sunlight or indoor light.

2. Description of the Related Art

A color liquid crystal display device is typically constructed as shown in the cross-sectional view of FIG. 1, wherein a liquid crystal 3 is encapsulated in a space between a color filter substrate 1 and an array substrate 2. The color filter substrate 1 comprises a transparent substrate 11 as a structural support, and a polarizing film 12 which is arranged on the observer's side surface of transparent substrate 11. Further, the opposite side (back face side) of transparent substrate 11 is partitioned into a large number of pixel regions wherein spaces between these pixel regions are filled with a light-shielding film 13 and these pixel regions are respectively provided with a transparent colored layer 14. This transparent colored layer 14 is designed to apply a color to the transmitted light passing through each of the pixels, so that transparent colored layers 14 of three different colors, i.e. red (R), green (G) and blue (B) corresponding to three primary colors of light, are generally arrayed for each of these pixels. Incidentally, the aforementioned light-shielding film 13 is designed to prevent the mixing of colors of transmitted light that has been colored by any one of these colors.

The color filter substrate 1 is further provided with an over-coat layer 15 for burying the step portions that have been formed by the transparent colored layers 14. Thereafter, a transparent electrode 16 and an orientation film (not shown) are successively formed on the over-coat layer 15, thereby accomplishing the color filter substrate 1.

On the other hand, the array substrate 2 which is disposed to face the color filter substrate 1 comprises a transparent substrate 21 as a structural support. Electrodes 23 and an orientation film (not shown) are arranged on the liquid crystal side surface of the transparent substrate 21, and a polarizing film 22 is arranged on the opposite side surface of the transparent substrate 21.

The pixels are designed to be respectively impressed with a voltage applied between the transparent electrode 16 and the electrodes 23, thereby controlling the transmission or non-transmission of light with the transmitted light being taken up as a display light for displaying images.

There are known various methods with respect to the method of forming the transparent colored layers 14 of the color filter substrate 1. Among them, the method which is now most commonly employed is a method using a negative type photosensitive coloring composition, wherein the coating film of this photosensitive coloring composition is subjected to the exposure of a proximity exposure system using a proximity aligner. More specifically, a photosensitive coloring composition is coated on a surface of a transparent substrate 11 having the aforementioned light-shielding film 13 formed thereon to form a coated film, to which ultraviolet rays are irradiated through a photomask which is provided with a light-shielding layer patterned corresponding to the transparent colored layers 14, wherein the photomask is disposed at a location spaced away from the coating film by a distance ranging from several ten to several hundred micrometers. As a result, the coating film is selectively exposed and cured. Then, the resultant coating film is subjected to a developing process using a developing solution to remove unexposed portions (un-cured portions) of the coated film, thereby accomplishing the transparent colored layers 14. Incidentally, the aforementioned procedures are repeated with respect to each coloring photosensitive coloring composition, thereby making it possible to form transparent colored layers of three colors 14R, 14G and 14B.

Meanwhile, the liquid crystal display device can be roughly classified into a device which utilizes, as a display light, the light of a light source such as a back-light, which is disposed on the rear side of the array substrate 2, and a device which utilizes, as a display light, the light that can be derived from the reflection of external light, such as outdoor light. The former is called a transmissive type liquid crystal display device, which is accompanied with a problem that, although it is capable of displaying a bright image, it requires a large magnitude of power since the light source thereof is required to be built in the interior of the device. On the other hand, the latter is called a reflective type liquid crystal display device, which is accompanied with a problem that, although it requires a relatively small magnitude of power, it is difficult to obtain a bright display image in a room where there is insufficient external light.

For these reasons, there has been proposed a liquid crystal display device which makes good use of not only the advantages of the transmissive type liquid crystal display device but also the advantages of the reflective type liquid crystal display device, whereby a bright images can be displayed by making use of the light of a built-in light source in a room while minimizing the power consumption through the utilization of external outdoor light. This liquid crystal display device is called a semitransmissive type liquid crystal display device. A semitransmissive type liquid crystal display device is already actually employed as a display device in mobile instruments, such as a cellular phone or digital still camera.

However, there is a problem with this semitransmissive type liquid crystal display device, as follows. Namely, when the light of a light source is to be utilized as a display light, this display light is caused to pass through the transparent colored layers 14 only once. Whereas, when the reflected light to be derived through the reflection of external light is to be utilized as a display light, this display light is caused to pass through the transparent colored layers 14 back and forth, i.e. twice. For this reason, when the reflected light to be derived through the reflection of external light is to be utilized as a display light, the loss of light is caused to increase due to the transparent colored layers 14, thus resulting in increased darkness of the display image.

There have been proposed various methods to overcome the aforementioned problem to thereby secure a brighter display image. For example, there is known a method wherein the pixel region is partitioned into two sections, i.e. a reflection section "b" and a transmission section "a", the reflection section "b" being utilized in a case where the reflected light is used as a display light for displaying an image, and the transmission section "a" being utilized in a case where the light from a light source is used as a display light for displaying an image. Namely, a reflective film is selectively provided at the reflection section and the external light entering this reflection section is utilized as a display light. On the other hand, the light from light source that can be derived from the rear side of the transmission section "a" is permitted to pass therethrough and be utilized as a display light.

The pixel regions of color filter substrate 1 of this semi-transmissive type liquid crystal display device are constructed as shown in FIG. 2. Namely, the transparent colored layer 14 which is located at the reflection section "b" is provided with a through-hole 14x, so that the transparent colored layer 14 does not exist in this through-hole 14x. Because of this, the display light passing through this through-hole 14x is free from any loss of light based on the existence of transparent colored layer 14, thereby making it possible to create a bright display image. The transparent colored layer 14 provided with this through-hole 14x can be also formed by a method wherein a negative type photosensitive coloring composition layer is subjected to exposure through a photomask provided with a light-shielding film having a corresponding pattern.

Incidentally, the display device for the aforementioned mobile instruments is also demanded to have a display image of higher definition, and hence the aforementioned through-hole 14x is also demanded to be of higher fineness. For example, if it is desired to enhance the resolution of a 2.4-inch type cellular phone with a conventional QVGA (320×240 pixels) resolution up to as high as QVGA (640×480 pixels), it is required to reduce the width of individual pixels of the RGB material layer from about 75 μm down to about 25 μm. Therefore, the through-hole to be formed in a pixel having a width of 25 μm is also required to be smaller in size. For example, the size of the through-hole is required to be decreased down to 10 μm or less in diameter.

However, when the exposure of a coated layer of a photosensitive coloring composition of a negative type is to be performed by making use of a photomask which is provided with a finely patterned light-shielding layer in order to form a color layer having such fine through-holes, diffraction of light is generated from the edge portions of light-shielding layer of the photomask, and the coated layer of the photosensitive coloring composition of the negative type is sensitized by this diffracted light, thereby raising a problem that the diameter of these through-holes cannot be accurately controlled.

Since the intensity of the diffracted light is generally smaller than the intensity of transmitted light (zeroth-order diffracted light), it is conceivable to accurately control the diameter of through-holes by taking advantage of this difference in intensity between the diffracted light and the transmitted light. Namely, based on an exposure sensitivity curve derived from the plotting of exposure sensitivity with the abscissa representing the common logarithm of the exposure applied to a coated layer of the photosensitive coloring composition of the negative type and the ordinate representing the residual rate of the film after development that, as the tangent of rising angle $\theta$ ($\tan \theta$) becomes higher, the contrast between the exposed portion and un-exposed portion after development becomes higher, thereby making it possible to enhance the resolution of through-holes. The details related to this phenomenon are described in "General Review on Latest Polymer Materials and Technology"; 37 (1988); Ishikawa et al., Tech. Publ. Co., Ltd.; and in "Organic Electronics Materials"; Science Forum; 15 (1986); Taniguchi et al.

When the exposure of the coated layer of a photosensitive coloring composition of the negative type is performed with the minimum possible quantity required of exposure by taking advantage of this principle, the coated layer would be sensitized by the transmitted light (zeroth-order diffracted light) while making it possible to prevent the coated layer from being sensitized by diffracted light which is lower in intensity than the transmitted light. Subsequently, when the sensitized coated layer is developed, it would be possible to form a transparent color layer wherein the residual rate of the film differs between the exposed portion and un-exposed portion. Accordingly, it is conceivable, in this manner, to accurately form through-holes each having a refined diameter.

However, it has been found out as a result of studies made by the present inventor that it was difficult to accurately create through-holes each having a diameter of 10 μm or less if only the $\tan \theta$ was controlled as described above. For example, when the photosensitive coloring composition of the negative type was highly sensitive and hence the minimum possible quantity required of exposure was small, the coated layer of the photosensitive coloring composition of negative type was rendered sensitive also to diffracted light and, because of this, it was found difficult to accurately form through-holes each having a fine diameter.

SUMMARY

An object of the present invention is to provide a photosensitive coloring composition which makes it possible to form a transparent color layer having fine through-holes each having a diameter of 10 μm or less.

Another object of the present invention is to provide a color filter substrate formed by the employment of the aforementioned photosensitive coloring composition.

A further object of the present invention is to provide a semitransmissive type liquid crystal display device provided with the aforementioned color filter substrate.

According to a first aspect of the present invention, there is provided a photosensitive coloring composition which comprises a photo-polymerizable monomer, a resinous binder, a polymerization initiator, a coloring agent and a solvent; and has an exposure sensitivity property in which $\gamma$ ($=\tan \theta$) is confined to 1.33 or more and a residual rate of a film of the photosensitive coloring composition after development is 0% at an exposure dose of not more than 23% of the minimum exposure dose that makes the residual rate of the film not lower than 85%, when a rising angle of an exposure sensitivity curve is defined as $\theta$ in the exposure sensitivity curve to be derived by plotting exposure sensitivity in coordinates with an abscissa thereof representing common logarithm of the exposure dose and with an ordinate thereof representing the residual rate of the film after development.

According to a second aspect of the present invention, there is provided a color filter substrate to be disposed on the observer's side surface of a liquid crystal display device, the color filter substrate comprising a transparent substrate, and a transparent color layer disposed on each of a large number of pixel regions which are formed through partitioning of the transparent substrate; wherein the pixel region is divided into a transmissive portion and a reflective portion, the transmissive portion being assigned to colorize a transmitted light from a light source disposed on the rear surface side of the liquid crystal display device and the reflective portion being assigned to colorized a reflected light to be derived from reflection of an external light entering from the observer's side; and wherein through-hole is formed in a region of the transparent color layer where the reflective portion is located, and part of the transparent color layer is formed of a cured layer of a photosensitive coloring composition comprising a photo-polymerizable monomer, a resinous binder, a polymerization initiator, a coloring agent and a solvent; the photosensitive coloring composition having an exposure sensitivity property in which $\gamma$ (=tan $\theta$) is confined to 1.33 or more and a residual rate of a film of the photosensitive coloring composition after development is 0% at an exposure dose of not more than 23% of the minimum exposure dose that makes the residual rate of the film not lower than 85%, when a rising angle of an exposure sensitivity curve is defined as $\theta$ in the exposure sensitivity curve to be derived by plotting exposure sensitivity in coordinates with an abscissa thereof representing common logarithm of the exposure dose and with an ordinate thereof representing the residual rate of the film after development.

According to a third aspect of the present invention, there is provided a semitransmissive type liquid crystal display device comprising the aforementioned color filter substrate, an array substrate disposed to face the color filter substrate, and a liquid crystal layer interposed between the color filter substrate and the array substrate.

BRIEF DESCRIPTION OF THE DRAWINGS

FIG. 5A is a cross-sectional view showing one step in the manufacturing method of a color filter substrate according to one embodiment of the present invention;

FIG. 5B is a cross-sectional view showing one step in the manufacturing method of a color filter substrate according to one embodiment of the present invention;

FIG. 5C is a cross-sectional view showing one step in the manufacturing method of a color filter substrate according to one embodiment of the present invention;

FIG. 5D is a cross-sectional view showing one step in the manufacturing method of a color filter substrate according to one embodiment of the present invention;

FIG. 5E is a cross-sectional view showing one step in the manufacturing method of a color filter substrate according to one embodiment of the present invention;

FIG. 5F is a cross-sectional view showing one step in the manufacturing method of a color filter substrate according to one embodiment of the present invention.

DESCRIPTION OF EMBODIMENTS

Figure 1:
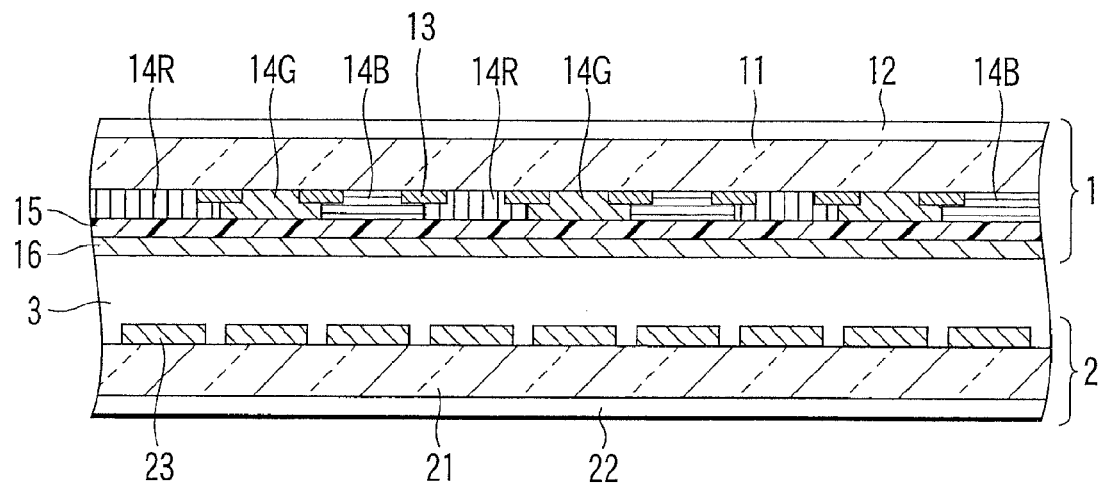
FIG. 1 is a cross-sectional view for explaining the construction of an ordinary color liquid crystal display device.
Figure 2:
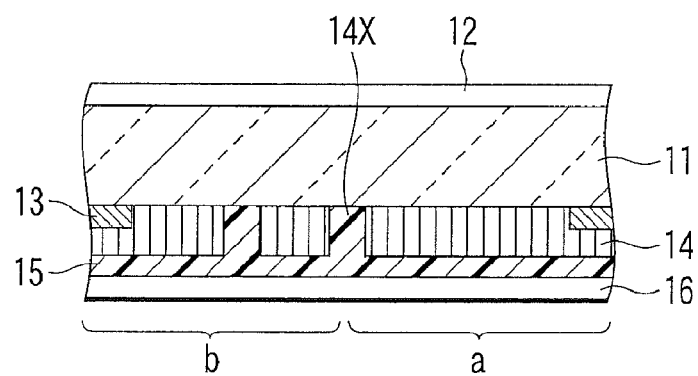
FIG. 2 is a cross-sectional view for explaining the construction of a color filter for a semitransmissive type liquid crystal display device.

Next, the best mode for carrying out the present invention will be explained.

The photosensitive coloring composition according to the first aspect of the present invention has an exposure sensitivity property in which $\gamma$ (=tan $\theta$) is confined to 1.33 or more and a residual rate of a film of the photosensitive coloring composition after development is 0% at an exposure dose of not more than 23% of the minimum exposure dose that makes the residual rate of the film not lower than 85%, when a rising angle of an exposure sensitivity curve is defined as $\theta$ in the exposure sensitivity curve to be derived by plotting exposure sensitivity in coordinates with an abscissa thereof representing common logarithm of the exposure dose and with an ordinate thereof representing the residual rate of the film after development.

According to the photosensitive coloring composition according to the first aspect of the present invention, since the value of $\gamma$=tan $\theta$ representing the contrast is confined to 1.33 or more, the difference in intensity between the transmitted light and the diffracted light sensitively reflects in the residual rate of the film, and, moreover, since the residual rate of the film after development is turned to 0% at the exposure dose of not more than 23% of the minimum exposure dose that makes the residual rate of the film not lower than 85%, it is possible to prevent the coloring composition from being cured by the diffracted light which is weak in intensity. Because of these reasons, it is now possible to accurately create a transparent color layer having fine through-holes.

By contrast, if a photosensitive coloring composition which does not satisfy the aforementioned conditions is employed, it would become difficult to accurately create a transparent color layer having fine through-holes.

Incidentally, the control of the exposure dose so as to limit the aforementioned contrast $\gamma$ and to make the residual rate of the film after development 0% can be performed by suitably adjusting the formulation of the photosensitive coloring composition. For example, the kind and quantity of the polymerization initiator, which is one of the essential components, may be suitably adjusted, and a suitable quantity of polymerization inhibitor may be added to the photosensitive coloring composition. Preferable examples of the polymerization inhibitor are hydroquinone and methoquinone.

For example, the compounds represented by the following chemical formula (1) can be employed as a polymerization inhibitor.

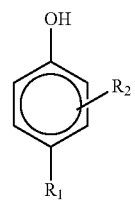

(wherein R1 is hydroxyl group or alkoxy group; and R2 is $C_nH_{2n+1}$ (n=0-4))

Further, as for the polymerization initiator, it is possible to employ an oxime ester-based polymerization initiator.

According to the photosensitive coloring composition according to the first aspect of the present invention, since the difference in intensity between the transmitted light and the diffracted light can sensitively reflect in the residual rate of the film and, moreover, since it is possible to prevent the coloring composition from being cured by the diffracted light which is weak in intensity, it is now possible to accurately create a transparent color layer having fine through-holes. Because of this, it is possible to manufacture a semitransmissive type liquid crystal display device which is high in resolution and in fineness.

The photosensitive coloring composition according to one embodiment of the present invention comprises, as essential components, a photo-polymerizable monomer, a resinous binder, a polymerization initiator, a coloring agent and a solvent. In addition to these components, it is also preferable that the photosensitive coloring composition further comprises a polymerization initiator. Furthermore, the photosensitive coloring composition may comprise additives such as a dispersing agent, a photosensitizer, and a chain-transfer agent.

The photosensitive coloring composition according to one embodiment of the present invention should be formulated such that $\gamma$ (=tan $\theta$) is confined to 1.33 or more and preferably 1.4 or more, when a rising angle of an exposure sensitivity curve is defined as $\theta$ in the exposure sensitivity curve to be derived by plotting exposure sensitivity in coordinates with an abscissa thereof representing common logarithm of the exposure dose and with an ordinate thereof representing the residual rate of the film after development. Incidentally, $\gamma$=tan $\theta$ represents a contrast in exposure sensitivity.

This exposure sensitivity curve can be easily determined through experiments wherein a coated film obtained through the coating of a photosensitive coloring composition on a substrate is subjected to exposure to the irradiation of ultraviolet rays and then subjected to development by making use of a developing solution, thereby making it possible to plot the relationship between the exposure dose and the residual rate of the film after development, thereby obtaining the exposure sensitivity curve.

Further, the photosensitive coloring composition according to the present invention should be formulated such that the residual rate of the film after development is turned to 0% at the exposure dose of not more than 23%, preferably not more than 25% of the minimum exposure that makes the residual rate of the film not lower than 85%. This residual rate of the film after development can be determined concurrently with the aforementioned exposure sensitivity curve.

Incidentally, by incorporating a polymerization inhibitor formed of hydroquinone or methoquinone in the photosensitive coloring composition, the quantity or exposure dose that enables to limit the aforementioned contrast $\gamma$ (contrast) and to make the residual rate of the film after development 0% can be easily controlled.

Next, each of the components constituting the photosensitive coloring composition according to one embodiment of the present invention will be explained.

Photopolymerizable Monomer

The photopolymerizable monomer is designed such that it can be polymerized by the irradiation of exposure light to make a coated film of photosensitive coloring composition insoluble to a developing solution. Generally, the photopolymerizable monomer is a monomer whose polymerization can be induced by radicals.

As for specific examples of such a photopolymerizable monomer which are useful in this case, they include poly-functional urethane acrylate which can be obtained through a reaction between (metha)acrylate having hydroxyl group and poly-functional isocyanate.

As for specific examples of (metha)acrylate having hydroxyl group, they include 2-hydroxyethyl(metha)acrylate, 4-hydroxybutyl(metha)acrylate, trimethylolpropane di(metha)acrylate, pentaerythritol tri(metha)acrylate, ditrimethylolpropane tri(metha)acrylate, dipentaerythritol penta(metha)acrylate, dipentaerythritol ethylene oxide-modified penta(metha)acrylate, dipentaerythritol caprolactone-modified penta(metha)acrylate, glycerol acrylate methacrylate, glycerol dimethacrylate, 2-hydroxy-3-acryloyl propylmethacrylate, a reaction product of an epoxy-containing compound with carboxy(metha)acrylate, hydroxyl group-containing polyol polyacrylate, etc.

As for specific examples of poly-functional isocyanate, they include tolylene diisocyanate, hexamethylene diisocyanate, diphenylmethylene diisocyanate, isophorone diisocyanate, polyisocyanate, etc.

Incidentally, it is preferable that the content of the photopolymerizable monomer in the composition of the present invention be confined to not more than 20% by weight based on 100% by weight of a total of the composition in view of the developing properties of the composition, the tackiness of the composition after being coated on a substrate and dried, and the stability of the composition. Furthermore, in view of the exposure sensitivity, resolution of pattern to be obtained and solvent resistance of the composition, the content of the photopolymerizable monomer in the composition should preferably be confined to not less than 1% by weight.

Resinous Binder

The resinous binder can be selected from those which enable an unexposed coated film of the photosensitive coloring composition to adhere and fix to a transparent substrate and which can be dissolved in a developing solution on the occasion of development. The resinous binder can be either photosensitive or non-photosensitive.

Nowadays, alkaline developing solutions which are less harmful to the environment are extensively employed as developing solutions. Because of this, it is desirable to use an alkali-soluble resin as the resinous binder. For example, it is possible to employ non-photosensitive resins having an acidic functional group such as a carboxyl group or sulfone group. Specific examples of such a non-photosensitive resin include acrylic resin, $\alpha$-olefin-(anhydrous) maleic acid copolymer, styrene-(anhydrous) maleic acid copolymer, styrene-styrene sulfonic acid copolymer, ethylene-(metha)acrylic acid copolymer, isobutylene-(anhydrous) maleic acid copolymer, etc. More preferable examples of such a non-photosensitive resin are acrylic resin, an $\alpha$-olefin-(anhydrous) maleic acid copolymer and styrene-styrene sulfonic acid copolymer. Since acrylic resin is especially high in heat resistance and transparency among these resins, the employment of acrylic resin is most preferable. Further, it is preferable to employ the resin having a weight average molecular weight ranging from 1,000 to 500,000, more preferably 5,000 to 100,000.

As for the photosensitive resin, it is possible to employ resins having an ethylenic unsaturated double bond introduced into the linear macromolecule thereof which can be attained through the reaction of a linear macromolecular compound having a reactive functional group with a (metha)acrylic compound having a substituent group which is capable of reacting with aforementioned reactive functional group, cinnamic acid, etc. Alternatively, it is possible to employ resins having an ethylenic unsaturated double bond introduced into the linear macromolecule thereof which can be attained through the reaction of a (metha)acrylic compound having a reactive functional group, cinnamic acid, etc. with a linear macromolecular compound having a substituent group which is capable of reacting with the aforementioned reactive functional group. As for specific examples of the reactive functional group, they include a hydroxyl group, carboxylic group, amino group, etc. As for specific examples of the substituent group which is capable of reacting with aforementioned reactive functional group, they include isocyanate group, aldehyde group, epoxy group, etc.

Further, it is also possible to employ, as a photosensitive resin, those which can be obtained through the half-esterification of a linear macromolecular compound, including acid anhydrides such as a styrene-anhydrous maleic acid copolymer and an α-olefin-maleic anhydride copolymer by making use of a (metha)acrylic compound having a hydroxyl group, such as a hydroxyalkyl (metha)acrylate, etc.

These photosensitive resins should preferably be selected from those having a weight average molecular weight ranging from 5,000 to 100,000.

Coloring Agent

The coloring agent is employed for coloring the transparent color layer, thereby coloring the display light of a liquid crystal display device. Although it is possible to utilize pigments and dyes as a coloring agent, it is more preferable to use pigments, in view of the higher durability thereof. As for the pigments, although they may be either organic pigments or inorganic pigments, it is more preferable to employ organic pigments. With respect to the mixing ratio of the coloring agent, although there is no particular limitation, it is preferable to confine the mixing ratio of the coloring agent to the range of about 1 to 20% by weight based on 100% by weight of the total quantity of the photosensitive coloring composition.

Incidentally, as for the tint of the coloring agent, although it can be optionally selected, when the tint of the photosensitive coloring composition is blue, the advantages of the present invention can be sufficiently realized. For example, the pigment may be formulated such that a blue or violet pigment is employed as a main component and red, orange, green and yellow pigments may be included therein as additive complementary colors.

Next, specific examples of organic pigments for use in the color layer will be described by the color index (C.I.) number system.

Pigment Blue: <C.I> 1, 1:2, 1:x, 9:x, 15, 15:1, 15:2, 15:4, 15:5, 15:6, 16, 22, 24, 24:x, 56, 60, 61, 62, 80.

Pigment Violet: <C.I> 1, 1:x, 3, 3:3, 3:x, 5:1, 19, 23, 27, 29, 30, 32, 37, 40, 42, 50.

Pigment Green: <C.I> 1, 1:x, 2, 2:x, 4, 7, 10, 36, 37.

Pigment Orange: <C.I> 2, 5, 13, 16, 17:1, 31, 34, 36, 38, 43, 46, 48, 49, 51, 52, 52, 55, 59, 60, 61, 62, 64, 71, 73.

Pigment Red: <C.I> 1, 2, 3, 4, 5, 6, 7, 8, 9, 10, 14, 17, 18, 22, 31, 38, 41, 48:1, 48:2, 48:3, 48:4, 49, 49:1, 49:2, 52:1, 52:2, 53:1, 57:1, 60:1, 63:1, 66, 67, 81:1, 81:3, 81:x, 83, 88, 90, 97, 98, 112, 119, 122, 123, 144, 146, 149, 166, 168, 169, 170, 171, 172, 175, 176, 177, 178, 179, 180, 184, 185, 187, 188, 190, 192, 200, 202, 206, 207, 208, 209, 210, 215, 216, 217, 220, 223, 224, 226, 227, 228, 240, 246, 254, 255, 264, 272, 279.

Pigment Yellow: <C.I> 1, 2, 3, 4, 5, 6, 10, 12, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 93, 94, 95, 97, 98, 100, 101, 104, 106, 108, 109, 110, 113, 114, 115, 116, 117, 118, 119, 120, 123, 125, 126, 127, 128, 129, 137, 138, 139, 144, 146, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214.

Further, in order to secure excellent coating properties, sensitivity, and developing properties while making it possible to retain the balance between the chroma and lightness through the combination of the aforementioned organic pigments, inorganic pigments may be used in combination with these organic pigments. As for the inorganic pigments useful in this case, it is possible to employ a metal oxide powder, metal sulfide powder, metal powder such as yellow lead, zinc chrome, red iron oxide (III), cadmium red, ultramarine blue, Prussian blue, chromium oxide green, cobalt green, etc. Further, for the purpose of toning, the photosensitive coloring composition may further contain dyes within the limits which do not deteriorate the heat resistance of the photosensitive coloring composition.

Dispersing Agent

When pigments are to be employed as a coloring agent, a dispersing agent should preferably be incorporated in the photosensitive coloring composition in order to facilitate the dispersion of the pigments. As for the dispersing agent, it is possible to employ a surfactant, an intermediate of pigment, an intermediate of dye, Solsperse, etc. Although there is no particular limitation with regard to the mixing ratio of the dispersing agent, it is preferable to confine the mixing ratio of the dispersing agent within the range of 1 to 10% by weight based on 100% by weight of the content of the pigment.

Polymerization Initiator

As for the polymerization initiator, it is preferable to employ an oxime ester-based polymerization initiator such as, for example, 1-[4-(phenylthio)-2-(O-benzoyl oxime)], and O-(acetyl)-N-(1-phenyl-2-oxo-2-(4'-methoxy-naphthyl)ethylidene)hydroxyl amine.

Further, in addition to this oxime ester-based polymerization initiator, it is also possible to co-use another kind of polymerization initiator. Specific examples of this additional polymerization initiator include an acetophenone-based compound, a benzoin-based compound, a benzophenone-based compound, a thioxanthone-based compound, a triazine-based compound, a phosphine-based compound, a quinone-based compound, a borate-based compound, a carbazole-based compound, an imidazole-based compound, a titanocene-based compound, etc.

As for specific examples of the acetophenone-based compound, they include 4-phenoxy dichloroacetophenone, 4-t-butyl-dichloroacetophenone, diethoxyacetophenone, 1-(4-isopropylphenyl)-2-hydroxy-2-methylpropan-1-one, 1-hydroxycyclohexylphenyl ketone, 2-benzyl-2-dimethyl-1-(4-morpholinophenyl)-butan-1-one, etc.

As for specific examples of the benzoin-based compound, they include benzoin, benzoin methyl ether, benzoin ethyl ether, benzoin isopropyl ether, benzyldimethyl ketal, etc.

As for specific examples of the benzophenone-based compound, they include benzophenone, benzoylbenzoic acid, benzoylmethyl benzoate, 4-phenyl benzophenone, hydroxybenzophenone, acrylated benzophenone, 4-benzoyl-4'-methyldiphenyl sulfide, etc.

As for specific examples of the thioxanthone-based compound, they include thioxanthone, 2-chlorothioxanthone, 2-methylthioxanthone, isopropylthioxanthone, 2,4-diisopropylthioxanthone, etc.

As for specific examples of the triazine-based compound, they include 2,4,6-trichloro-s-triazine, 2-phenyl-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-piperonyl-4,6-bis(trichloromethyl)-s- triazine, 2,4-bis(trichloromethyl)-6-styryl-s-triazine, 2-(naphtho-1-yl)-4,6-bis(trichloromethyl)-s-triazine, 2-(4-methoxynaphtho-1-yl)-4,6-bis(trichloromethyl)-s-triazine, 2,4-trichloromethyl-(piperonyl)-6-triazine, 2,4-trichloromethyl(4'-methoxystyryl)-6-triazine, etc.

As for specific examples of the phosphine-based compound, they include bis(2,4,6-trimethylbenzoyl)phenylphosphine oxide, 2,4,6-trimethylbenzoyl diphenylphosphine oxide, etc.

As for specific examples of the quinone-based compound, they include 9,10-phenanthrene quinone, camphor quinone, ethylanthraquinone, etc.

The mixing ratio of the polymerization initiator should preferably be confined to 0.5-50% by weight, more preferably 3-30% by weight based on a total weight of solid matter of the photosensitive coloring composition.

Photosensitizer

The photosensitive coloring composition of the present invention should preferably be formulated so as to contain a photosensitizer in addition to the polymerization initiator.

As for the photosensitizer, it is possible to employ amine-based compounds. For example, it is possible to employ triethanol amine, methyldiethanol amine, triisopropanol amine, 4-dimethylaminomethyl benzoate, 4-dimethylaminoethyl benzoate, 4-dimethylaminoisoamyl benzoate, 2-dimethylaminoethyl benzoate, 4-dimethylamino-2-ethylhexyl benzoate, N,N-dimethylparatoluidine, 4,4'-bis(dimethylamino) benzophenone, 4,4'-bis(diethylamino) benzophenone, 4,4'-bis(ethylmethylamino) benzophenone, etc.

Further, it is also possible to employ, as a photosensitizer, α-acyloxy ester, acylphosphine oxide, methylphenyl glyoxylate, benzyl, 9,10-phenanthrene quinone, camphor quinine, ethylanthraquinone, 4,4'-diethyl isophthalophenone, 3,3',4,4'-tetra(t-butyl peroxycarbonyl)benzophenone, etc.

The mixing ratio of the photosensitizer should preferably be confined to 0.5-60% by weight, more preferably 3-40% by weight based on the quantity of a total of the photopolymerization initiator and the photosensitizer.

Polymerization Inhibitor

The photosensitive coloring composition of the present invention may be formulated so as to contain a polymerization inhibitor. Since γ (=tan θ: contrast) and the exposure dose that makes the residual rate of the film after development zero can be controlled in accordance with the kind and mixing ratio of this polymerization inhibitor, the employment of the polymerization inhibitor is important.

As for the polymerization inhibitor, it is possible to preferably employ compounds represented by the following chemical formula (I). For example, it is possible to employ hydroquinone, methoquinone, etc.

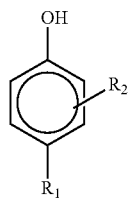

(wherein R1 is hydroxyl group or alkoxy group; and R2 is CnH2n+1 (n=0-4))

In addition to these compounds, it is also possible to employ pyrogallol, tert-butylcatechol, cuprous chloride, 2,6-di-tert-butyl-p-cresol, etc.

The mixing ratio of the polymerization inhibitor should preferably be confined to 0.001-0.050% by weight based on a total weight of solid matter of the photosensitive coloring composition. If the mixing ratio of the polymerization inhibitor is less than 0.001% by weight, the effects expected of polymerization initiator may become insufficient. If the mixing ratio of the polymerization inhibitor is higher than 0.050% by weight, the sensitivity of the photosensitive coloring composition may be deteriorated, thus raising adverse effects.

Chain-Transfer Agent

The photosensitive coloring composition of the present invention may further comprise a polyfunctional thiol which is capable of acting as a chain-transfer agent. As for this chain-transfer agent, it is possible to employ a compound having two or more thiol groups. Specific examples of such a compound include hexane dithiol, decane dithiol, 1,4-butanediol bisthiopropionate, 1,4-butanediol bisthioglycolate, ethyleneglycol bisthioglycolate, ethyleneglycol bisthiopropionate, trimethylolpropane tristhioglycolate, trimethylolpropane tristhiopropionate, trimethylolpropane tris(3-mercaptobutylate), pentaerythritol tetrakisthioglycolate, pentaerythritol tetrakisthiopropionate, trimercaptopropionate tris(2-hydroxyethyl)isocyanulate, 1,4-dimethylmercaptobenzene, 2,4,6-trimercapto-s-triazine, 2-(N,N-dibutylamino)-4,6-dimercapto-s-triazine, etc.

The mixing ratio of these polyfunctional thiols should preferably be confined to 0.1-30% by weight, more preferably 1-20% by weight based on a total weight of solid matter of the photosensitive coloring composition. If the mixing ratio of the polyfunctional thiols is less than 0.1% by weight, the effects expected of polyfunctional thiols may become insufficient. If the mixing ratio of the polyfunctional thiols is higher than 30% by weight, the sensitivity of photosensitive coloring composition may become excessive, thereby deteriorating the resolution on the contrary.

Solvent

The solvent is used for enabling the photosensitive coloring composition to be coated uniformly on the surface of a transparent substrate and for enabling the coloring agent to be uniformly dispersed in the photosensitive coloring composition. As for the examples of the solvent, it is possible to employ water, an organic solvent, etc. Specific examples of such an organic solvent include cyclohexanone, ethyl Cellosolve acetate, butyl Cellosolve acetate, 1-methoxy-2-propyl acetate, diethyleneglycol dimethyl ether, propylene glycol monomethylether acetate, ethyl benzene, ethyleneglycol diethyl ether, xylene, ethyl Cellosolve, methyl-n-amyl ketone, propyleneglycol monomethyl ether, toluene, methylethyl ketone, ethyl acetate, methanol, ethanol, isopropyl alcohol, butanol, isobutyl ketone, petroleum solvent, etc. Method of preparing the photosensitive coloring composition Next, the method of preparing the photosensitive coloring composition according to the present invention will be explained. The photosensitive coloring composition of the present invention can be prepared by following known methods. For example, the photosensitive coloring composition of the present invention, which comprises a photo-polymerizable monomer, a resinous binder, pigment, a dispersing agent and a solvent, can be prepared according to any one of the following methods (1)-(4).

(1) A pigment composition which has been prepared in advance by mixing a pigment with a dispersing agent is added to and dispersed in a solution of a photopolymerizable monomer and/or a resinous binder which is dissolved in a solvent. Thereafter, other components of the photosensitive coloring composition are added to the resultant solution.

(2) A pigment and a dispersing agent are separately added to and dispersed in a solution of a photopolymerizable monomer and/or a resinous binder which is dissolved in a solvent. Thereafter, other components of the photosensitive coloring composition are added to the resultant solutions.

(3) A pigment is added to and dispersed in a solution of a photopolymerizable monomer and/or a resinous binder which is dissolved in a solvent to thereby obtain a dispersion. Thereafter, a pigment-dispersing agent is added to the dispersion and then other components of the photosensitive coloring composition are added to the resultant dispersion.

(4) Two kinds of solutions, each comprising a photopolymerizable monomer and/or a resinous binder which is dissolved in a solvent, are prepared. Thereafter, a pigment and a dispersing agent are separately added to and dispersed in one of the solutions. Then, these solutions are mixed together to obtained a mixed solution to which other components of the photosensitive coloring composition are added. Incidentally, solely the pigment or solely the dispersing agent may be dispersed in a solvent.

The dispersion of the pigment and the dispersing agent can be carried out by making use of various dispersing devices, such as a triple roll mill, a twin-roll mill, a sand mill, a kneader, a dissolver, a high-speed mixer, a homogenizer, an attritor, etc.

Further, on the occasion of preparing a pigment composition through the mixing of a pigment and a dispersing agent, although it can be accomplished by simply mixing a powdery pigment with a powdery dispersing agent, it is more preferable to employ a mixing method (a) wherein these powdery components are mechanically mixed together by means of various kinds of mixing machines, such as a kneader, rolls, an attritor, a super-mill, etc.; a mixing method (b) wherein a pigment is dispersed in a solvent to obtain a dispersion and then a solution containing a dispersing agent is added to the dispersion, thereby enabling the dispersing agent to adsorb on the surface of pigment; and a mixing method (c) wherein a pigment and a dispersing agent are co-dissolved in a strong solvent exhibiting a strong dissolving power, such as sulfuric acid, etc. and then the pigment and the dispersing agent are co-precipitated by making use of a poor solvent such as water.

Method of Manufacturing a Color Filter Substrate

Next, a method of manufacturing a color filter substrate according to the present invention will be explained.

Figure 3:
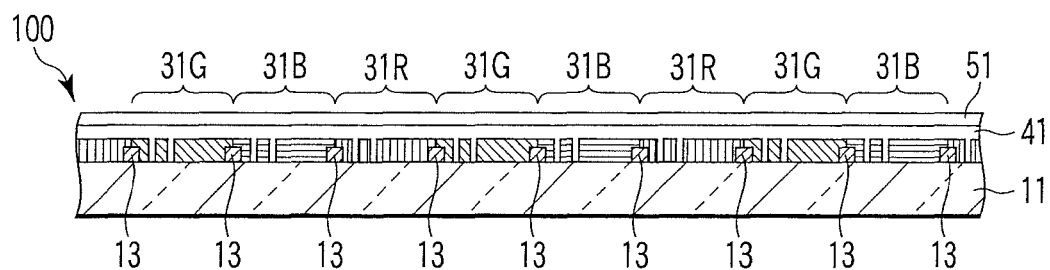
FIG. 3 is a cross-sectional view for explaining the construction of a color filter substrate according to one embodiment of the present invention.

FIG. 3 schematically illustrates the construction of a color filter substrate according to one embodiment of the present invention. Referring to FIG. 3, a black matrix 13 is formed at predetermined locations of a transparent substrate 11. In the regions encircled by this black matrix 13, there are formed a transparent red pixel 31R, a transparent green pixel 31G and a transparent blue pixel 31B, each having through-holes formed therein. An over-coat layer 41, a transparent electrode 51 and an orientation film (not shown) are successively formed on all the transparent red pixels 31R, transparent green pixels 31G and transparent blue pixels 31B, thereby fabricating a color filter substrate 100 according to one embodiment of the present invention.

Figure 4:
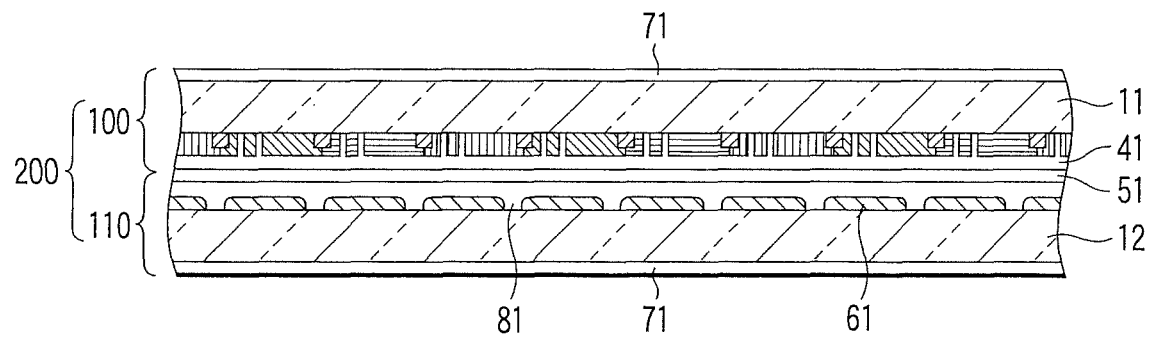
FIG. 4 is a cross-sectional view for explaining the construction of a semitransmissive type liquid crystal display device wherein the color filter substrate shown in FIG. 3 is employed.

FIG. 4 schematically illustrates one example of the construction of a semitransmissive type liquid crystal display device wherein the color filter substrate 100 shown in FIG. 3 is employed. Referring to FIG. 4, the color filter substrate 100 shown in FIG. 3 is laminated with an array substrate 110 having electrodes 61 formed at predetermined locations of the transparent substrate 12 to thereby create a cell into which a liquid crystal 81 is encapsulated. Thereafter, a polarizing film 71 is disposed on the opposite surfaces of the cell to construct the semitransmissive type liquid crystal display device 200 according to one embodiment of the present invention.

FIGS. 5A-5F show respectively a cross-sectional view for schematically illustrating the steps in sequence of the manufacturing method of a color filter substrate according to one aspect of the present invention First of all, a photosensitive black color composition containing a black pigment (for example, carbon black) dispersed in a photosensitive resin is coated on a transparent substrate 11 by means of a roll-coating method, etc. to thereby form a black photosensitive layer. The surface of this black photosensitive layer is then subjected to patterning exposure and thereafter to development. The pattern thus developed is then heated to fix it, thereby creating a black matrix 13 at predetermined locations on transparent substrate 11 (FIG. 5A).

As for the materials for the transparent substrate 11, it is possible to suitably utilize not only a glass substrate but also a resinous substrate made of polycarbonate, polymethylmethacrylate, polyethylene phthalate, etc. As for the black matrix 13, it may be a metallic thin film pattern made of chromium.

Next, a red pigment (for example, dianthraquinone-based pigment), a polymerization initiator (for example, oxime ester-based polymerization initiator), a dispersing agent, a photosensitizer (for example, amine compounds), a polymerization inhibitor (for example, hydroquinone) and a solvent are respectively added at predetermined ratios to an acrylic photosensitive resin and then the resultant mixture is subjected to mixing and dispersion, thereby preparing a photosensitive red color composition.

The photosensitive red color composition thus obtained is coated on the surface of transparent substrate 11 having the black matrix 13 formed thereon by means of a roll coating method and the resultant coated layer is prebaked to form a red photosensitive layer 31r (FIG. 5B).

As for the coating method to be employed herein, it is also possible to employ a spray coating method, a spin-coating method, etc.

Next, the red photosensitive layer 31r is subjected to patterning exposure through a photomask and then to development, thereby forming, between black matrixes 13, transparent red pixels 31R, each of which is constituted by a red reflection portion 31Rb having though-holes 31x, and by a red transmissive portion 31Ra (FIG. 5C).

It is needless to say that the transparent red pixel 31R which is constituted by a red reflection portion 31Rb and a red transmissive portion 31Ra is required to be subjected to a step to completely fix it, through heat treatment, after finishing the development. Once the transparent red pixel 31R is thermally fixed, it can be completely prevented from being adversely influenced by the developing solutions to be employed on the occasion of forming green pixels or blue pixels in the subsequent steps. Meanwhile, the measurement for assessing the sensitivity for obtaining the aforementioned exposure sensitivity curve is performed immediately after the development and prior to the thermal fixing.

The sensitivity of each of the photosensitive coloring compositions prepared in each of Examples and Comparative Examples was assessed as follows.

As for the patterning exposure, it can be suitably carried out by way of a proximity exposure system using a proximity aligner, wherein the exposure dose is regulated so as to make the residual film ratio 85% or more after development.

In this case, regions of the red photosensitive layer 31r which are located corresponding to the light-shielding pattern of photomask, i.e. unexposed regions, are prevented from being cured so that these unexposed regions are completely removed in the developing step. When the exposure is performed with the exposure dose which makes the ratio of the residual film not lower than 85%, even though the regions which are located corresponding to the light-shielding pattern of photomask, i.e. unexposed regions, may be slightly sensitized by the diffracted light, the regions which are located corresponding to the apertures of photomask, i.e. exposed regions, are enabled to sufficiently cure, thereby making it possible to create transparent red pixels having a sufficient area.

Incidentally, a solution of a water-soluble resin or an alkaline water-soluble resin (for example, polyvinyl alcohol or water-soluble acrylic resin, etc.) may be coated on the surface of red photosensitive layer 31r prior to the step of patterning exposure. The coating of these resins is effective in minimizing the inhibition of polymerization by the oxygen in an ambient atmosphere and also in enhancing the sensitivity of red photosensitive layer 31r.

As for the developing solution to be employed on the occasion of a developing treatment, it is possible to employ an alkaline developing solution such as an aqueous alkaline solution or an organic alkaline solution. As for the aqueous alkaline solution, it is possible to employ sodium carbonate, sodium hydroxide, etc. As for the organic alkaline solution, it is possible to employ dimethylbenzyl amine, triethanol amine, etc. Further, if required, the developing solution may contain a defoaming agent or a surfactant.

Then, in almost the same manner as described in the process of forming the aforementioned transparent red pixel 31R, the transparent green pixel 31G is formed. Namely, a green pigment (for example, phthalocyanine green type pigment), a polymerization initiator (for example, oxime ester-based polymerization initiator), a dispersing agent, a photosensitizer (for example, amine compounds), a polymerization inhibitor (for example, hydroquinone) and a solvent are respectively added at predetermined ratios to an acrylic photosensitive resin and then the resultant mixture is subjected to mixing and dispersion, thereby preparing a photosensitive green color composition.

The photosensitive green color composition thus obtained is then coated on the surface of transparent substrate 11 having the black matrix 13 and the transparent red pixel 31R formed thereon by means of a roll coating method and the resultant coated layer is prebaked to form a green photosensitive layer. Then, the green photosensitive layer is subjected to patterning exposure through a photomask, which is followed by a step of development and a step of fixing by means of heat treatment, thereby forming, between black matrixes 13, transparent green pixels 31G each of which is constituted by a green reflection portion 31Gb having though-holes 31x and by a green transmissive portion 31Ga (FIG. 5D).

Furthermore, in almost the same manner as described in the process of forming the aforementioned transparent red pixel 31R, the transparent blue pixel 31B is formed. Namely, a blue pigment (for example, phthalocyanine blue type pigment), a polymerization initiator (for example, oxime ester-based polymerization initiator), a dispersing agent, a photosensitizer (for example, amine compounds), a polymerization inhibitor (for example, hydroquinone) and a solvent are respectively added at predetermined ratios to an acrylic photosensitive resin and then the resultant mixture is subjected to mixing and dispersion, thereby preparing a photosensitive blue color composition.

Then, the photosensitive blue color composition thus obtained is coated on the surface of transparent substrate 21 having the black matrix 13, the transparent red pixel 31R and the transparent green pixel 31G formed thereon by means of roll coating method and the resultant coated layer is prebaked to form a blue photosensitive layer. Then, the blue photosensitive layer is subjected to patterning exposure through a photomask, which is followed by a step of development and a step of fixing by means of heat treatment, thereby forming, between black matrixes 13, transparent blue pixels 31B each of which is constituted by a blue reflection portion 31Bb having though-holes 31x and by a blue transmissive portion 31Ba (FIG. 5E).

Thereafter, an over-coat layer 41, a transparent electrode 51 and an orientation film (not shown) are successively formed on all the transparent red pixels 31R, transparent green pixels 31G and transparent blue pixels 31B, thereby fabricating a color filter substrate 100 according to one embodiment of the present invention (FIG. 5F).

The color filter substrate 100 fabricated as described above is laminated with an array substrate 110 having electrodes 61 formed at predetermined locations of the transparent substrate 12 to thereby create a cell into which a liquid crystal 81 is encapsulated. Thereafter, a polarizing film 71 is disposed on the opposite surfaces of the cell to construct the semitransmissive type liquid crystal display device 200 as shown in FIG. 4.

EXAMPLES

Next, examples of the present invention and comparative examples will be specifically explained. Incidentally, "part(s)" mentioned in examples and comparative examples means "part(s) by weight".

Example 1

Preparation of Coloring Compositions

A blue coloring composition to be employed for the manufacture of a color filter was prepared according to the following procedures.

Preparation of Pigment Dispersion

A mixture having the following composition was homogeneously stirred and then, by making use of an Eiger mill (Eiger Japan Co., Ltd.; "Mini-model M-250, MKII") using zirconia beads having a diameter of 1 mm, the dispersion of the components of the composition was performed for 2 hours and the resultant product was subjected to filtration by making use of a 5 μm aperture filter to obtain a pigment dispersion.

| | |
|---|---:|
| ε-type copper phthalocyanine pigment (C.I. Pigment Blue 15:6) (BASF Co., Ltd.; "Heliogen Blue-L-6700F") | 11.0 parts |
| Phthalocyanine pigment derivative represented by the following chemical formula (2) | 1.0 part |

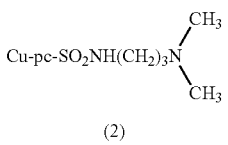

(2)
(wherein Cu-pc denotes a copper phthalocyanine residue)

| | |
|---|---:|
| Solution of photosensitive transparent resin | 9.9 parts |
| Solution of non-photosensitive transparent resin | 30.1 parts |
| Cyclohexanone | 48.0 parts |

Preparation of Photosensitive Coloring Composition

Then, a mixture having the following composition was homogeneously stirred and the resultant mixture was subjected to filtration by making use of a 1 µm aperture filter to obtain a photosensitive coloring composition.

| | |
|---|---|
| Aforementioned dispersion | 52.0 parts |
| Acrylic varnish | 7.0 parts |
| Photopolymerizable monomer | 3.5 parts |
| (Tohwa Gosei Co., Ltd.; "Aronix M-402") | |
| Oxime ester-based photopolymerization initiator | 1.0 part |
| (Ciba Speciality Chemicals Co., Ltd.; "IrgOXE01") | |
| Photopolymerization initiator | 1.0 part |
| (Ciba Speciality Chemicals Co., Ltd.; "Irg379") | |
| Photosensitizer | 0.2 part |
| (Hodogaya Chemicals Co., Ltd.; "EAB-F") | |
| Cyclohexanone | 21.5 parts |
| Propyleneglycol monomethylether acetate | 13.8 parts |

Thereafter, 0.5 parts of an anone solution containing 1% of hydroquinone was added to the aforementioned blue coloring composition to obtain the blue photosensitive coloring composition of this example.

Example 2

The blue photosensitive coloring composition of this example was manufactured by repeating the same procedures as described in Example 1 except that the quantity of the anone solution containing 1% of hydroquinone was changed to 0.8 parts.

Example 3

A mixture having the following composition was homogeneously stirred and then, by making use of a 1 µm aperture filter, the resultant product was subjected to filtration to obtain a blue coloring composition having photosensitivity.

| | |
|---|---|
| Aforementioned dispersion | 52.0 parts |
| Acrylic varnish | 7.0 parts |
| Photopolymerizable monomer | 3.5 parts |
| (Tohwa Gosei Co., Ltd.; "Aronix M-402") | |
| Photopolymerization initiator | 2.0 parts |
| (Ciba Speciality Chemicals Co., Ltd.; "Irg379") | |
| Photosensitizer | 0.2 parts |
| (Hodogaya Chemicals Co., Ltd.; "EAB-F") | |
| Cyclohexanone | 21.5 parts |
| Propyleneglycol monomethylether acetate | 13.8 parts |

Thereafter, 1.0 part of an anone solution containing 1% of hydroquinone was added to the aforementioned blue coloring composition to obtain the blue photosensitive coloring composition of this example.

Example 4

A mixture having the following composition was homogeneously stirred and then, by making use of a 1 µm aperture filter, the resultant product was subjected to filtration to obtain a blue coloring composition having photosensitivity.

| | |
|---|---|
| Aforementioned dispersion | 52.0 parts |
| Acrylic varnish | 7.0 parts |
| Photopolymerizable monomer | 3.5 parts |
| (Tohwa Gosei Co., Ltd.; "Aronix M-402") | |
| Oxime ester-based photopolymerization initiator | 2.0 parts |
| (Ciba Speciality Chemicals Co., Ltd.; "CGI242") | |
| Photosensitizer | 0.2 parts |
| (Hodogaya Chemicals Co., Ltd.; "EAB-F") | |
| Cyclohexanone | 21.5 parts |
| Propyleneglycol monomethylether acetate | 13.8 parts |

Thereafter, 1.5 parts of an anone solution containing 1% of hydroquinone was added to the aforementioned blue coloring composition to obtain the blue photosensitive coloring composition of this example.

Example 5

The blue photosensitive coloring composition of this example was manufactured by repeating the same procedures as described in Example 1 except that 0.5 parts of the anone solution containing 1% of hydroquinone which was added to the blue coloring composition prepared in Example 1 was replaced by 0.8 parts of an anone solution containing 1% of methoquinone.

Example 6

The blue photosensitive coloring composition of this example was manufactured by repeating the same procedures as described in Example 5 except that the quantity of the anone solution containing 1% of methoquinone was changed to 1.0 part.

Example 7

A mixture having the following composition was homogeneously stirred and then, by making use of a 1 µm aperture filter, the resultant product was subjected to filtration to obtain a blue photosensitive coloring composition.

| | |
|---|---|
| Aforementioned dispersion | 52.0 parts |
| Acrylic varnish | 7.0 parts |
| Photopolymerizable monomer | 3.5 parts |
| (Tohwa Gosei Co., Ltd.; "Aronix M-402") | |
| Oxime ester-based photopolymerization initiator | 2.0 parts |
| (Ciba Speciality Chemicals Co., Ltd.; "IrgOXE01") | |
| Photosensitizer | 0.2 parts |
| (Hodogaya Chemicals Co., Ltd.; "EAB-F") | |
| Cyclohexanone | 21.5 parts |
| Propyleneglycol monomethylether acetate | 13.8 parts |

Comparative Example 1

The blue photosensitive coloring composition was manufactured by repeating the same procedures as described in Example 1 except that neither the anone solution containing 1% of hydroquinone nor the anone solution containing 1% of methoquinone was added to the composition.

Comparative Example 2

A mixture having the following composition was homogeneously stirred and then, by making use of a 1 µm aperture filter, the resultant product was subjected to filtration to obtain a blue coloring composition having photosensitivity.

| Aforementioned dispersion | 52.0 parts |
|---|---|
| Acrylic varnish | 7.0 parts |
| Photopolymerizable monomer (Tohwa Gosei Co., Ltd.; "Aronix M-402") | 7.0 parts |
| Photopolymerization initiator (Ciba Speciality Chemicals Co., Ltd.; "CGI242") | 4.0 parts |
| Photosensitizer (Hodogaya Chemicals Co., Ltd.; "EAB-F") | 0.2 parts |
| Cyclohexanone | 18.0 parts |
| Propyleneglycol monomethylether acetate | 11.8 parts |

Assessment of Sensitivity

Each of the photosensitive coloring compositions prepared in these Examples and Comparative Examples was assessed with respect to the sensitivity thereof.

Namely, first of all, the photosensitive coloring composition obtained as described above was coated, by means of a spin-coating method, on the surface of a glass substrate and then allowed to dry to form a coated film having a film thickness of 2.0 μm. Thereafter, the coated film was prebaked for 20 minutes at a temperature of 70° C. and then exposed, by means of a proximity exposure system using a proximity aligner, to ultraviolet rays through a photomask with a fine pattern having a line width of 50 μm. The exposure dose was varied over nine levels within the range of 10 mJ/cm² to 300 mJ/cm².

Then, by making use of a 1.25 wt % sodium carbonate solution, the coated film thus exposed was subjected to shower development, immediately after which the coated film thus developed was washed with water, thereby finishing the patterning without subjecting the coated film to heating/fixing treatment.

Figure 6:
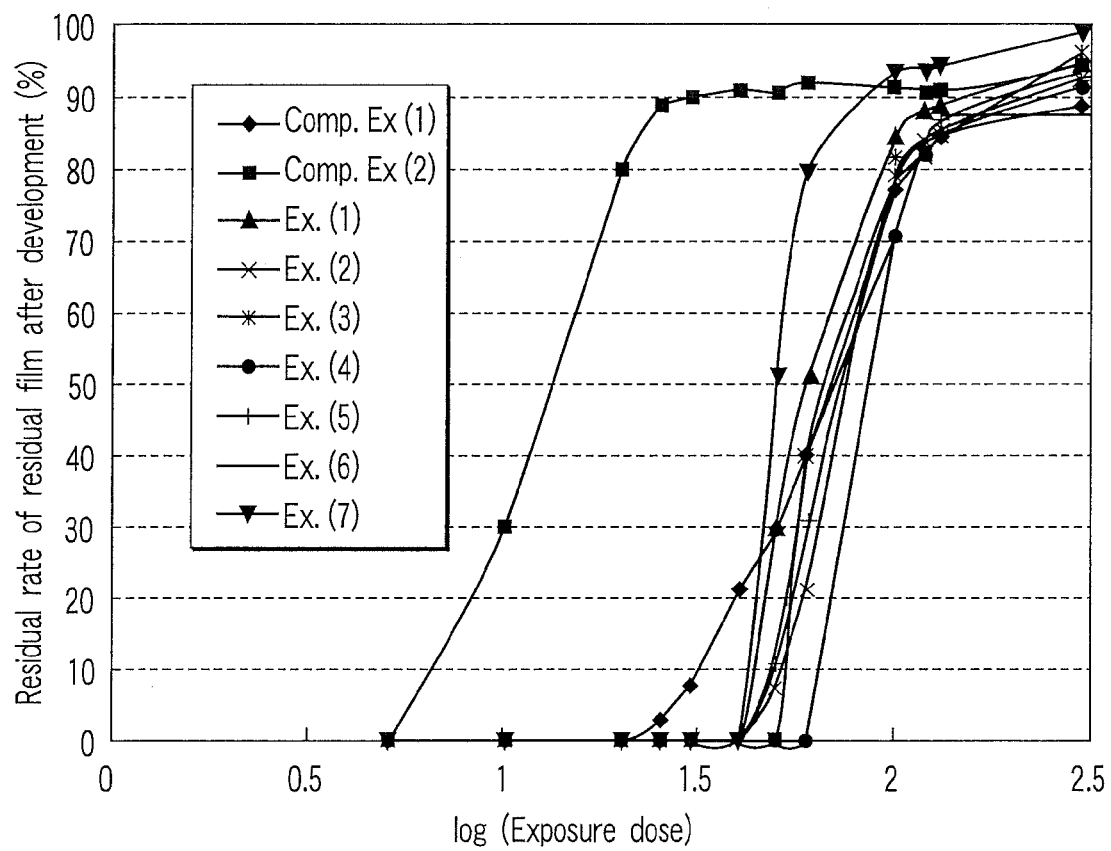
FIG. 6 is a graph illustrating curves of examples of the present invention and of comparative examples, each curve representing the residual rate of the film after the development of film.

Then, the film thickness of the filter segment thus obtained was divided by the film thickness (2.0 μm) of an unexposed/undeveloped region, thereby calculating the residual rate of the film. By making use of a coordinate system with the abscissa thereof representing the common logarithm of the exposure applied to the coated layer and the ordinate thereof representing the residual rate of the film after development, the sensitivity was plotted to obtain an exposure sensitivity curve, as shown in FIG. 6. Based on the exposure sensitivity curve thus obtained, the initial exposure dose in the exposure sensitivity curve was defined as a rising exposure dose and the minimum exposure dose needed to attain a residual rate of 85% or more was defined as a saturated exposure dose, and, from the following equation, the tan θ of the exposure sensitivity curve (θ is a rising angle)=γ (contrast) and the sensitivity cut rate were calculated.

$$\gamma=0.85/((\text{Log}(\text{saturated exposure dose})-\text{Log}(\text{rising exposure dose})))$$

$$\text{Sensitivity cut rate}=\text{Rising exposure dose}/\text{Saturated exposure dose}$$

Assessment of patterning properties

Each of the photosensitive coloring compositions prepared in these Examples and Comparative Examples was assessed with respect to the patterning properties thereof.

Namely, first of all, the photosensitive coloring composition obtained as described above was coated by means of a spin-coating method on the surface of a glass substrate and then allowed to dry to form a coated film having a film thickness of 2.0 μm. Thereafter, the coated film was prebaked for 20 minutes at a temperature of 70° C. and then exposed, by means of proximity exposure system using a proximity aligner, to ultraviolet rays through a photomask with an octagonal hole pattern having a width of 6-20 μm. The exposure dose was set to 100 mJ/cm².

Then, by making use of a 1.25 wt % sodium carbonate solution, the coated film thus exposed was subjected to shower development, immediately after which the coated film thus developed was washed with water, thereby finishing the patterning. The developing time was defined as an appropriate time needed to wash away the unexposed coated film. Then, the residual film was heat-treated for 60 minutes at a temperature of 230° C. to manufacture a test substrate.

The through-holes of the transparent layer thus obtained were assessed with respect to (1) the through-hole width (the width of a through-hole of the transparent color layer relative to the hole width of the photomask), and (2) the cross-sectional configuration of through-holes of the transparent layer.

With respect to the aforementioned item (1), the assessment thereof was performed by making use of an optical microscope. As for the ranks of this assessment, the transparent color layer which made it possible to obtain a through-hole having a width which was not smaller than the width of the through-hole of photomask and also having no color residue in the interior of the through-hole was indicated by "○", and the layer which failed to satisfy these conditions was indicated by "x".

With respect to the aforementioned item (2), the assessment thereof was performed by making use of a scanning electron microscope (SEM). As for the ranks of this assessment, the transparent color layer with a through-hole having a cross-sectional configuration tapered ordinary, or not tapered, was indicated by "○", and the layer with a through-hole having a cross-sectional configuration tapered reversely was indicated by "x".

Results

The results thus obtained are summarized in the following Table 1.

TABLE 1

|  |  | Ex. 1 | Ex. 2 | Ex. 3 | Ex. 4 | Ex. 5 | Ex. 6 | Ex. 7 | Comp. Ex. 1 | Comp. Ex. 2 |
|---|---|---|---|---|---|---|---|---|---|---|
| Polymerization initiator | | HQ | HQ | HQ | HQ | MQ | MQ | — | — | — |
| Content of 1% anone solution | | 0.5 part | 0.8 part | 1.0 part | 1.5 part | 0.8 part | 1.0 part | 0.0 part | — | — |
| Initiator | Irg379 | ○ | ○ | ○ | — | ○ | ○ | — | ○ | — |
|  | IrgOXE01 | ○ | ○ | — | — | ○ | ○ | ○ | ○ | — |
|  | CGI242 | — | — | — | ○ | — | — | — | — | ○ |
| Rising exposure (mJ/cm²) | | 40 | 40 | 50 | 60 | 40 | 30 | 40 | 20 | 5 |
| Saturated exposure (mJ/cm²) | | 100 | 130 | 130 | 130 | 130 | 120 | 100 | 130 | 25 |
| γ | | 2.1 | 1.7 | 2.0 | 2.5 | 1.7 | 1.4 | 2.1 | 1.0 | 1.3 |
| Sensitivity cut rate (%) | | 40.0 | 30.8 | 38.5 | 46.2 | 30.8 | 25.0 | 40.0 | 15.4 | 20.0 |
| Configuration of pattern | | ○ | ○ | ○ | ○ | ○ | ○ | ○ | ○ | ○ |

TABLE 1-continued

|  |  | Ex. 1 | Ex. 2 | Ex. 3 | Ex. 4 | Ex. 5 | Ex. 6 | Ex. 7 | Comp. Ex. 1 | Comp. Ex. 2 |
|---|---|---|---|---|---|---|---|---|---|---|
| Hole width | 6 μm | X | X | ○ | ○ | X | ○ | ○ | X | X |
|  | 8 μm | ○ | ○ | ○ | ○ | ○ | ○ | ○ | X | X |
|  | 10 μm | ○ | ○ | ○ | ○ | ○ | ○ | ○ | X | X |

Note 1: HQ: Hydroquinone
Note 2: MQ: Methoquinone

As shown in Table 1, in the cases of Examples 1-6 where the blue photosensitive coloring compositions which were prepared through the employment of an anone solution containing 1% of hydroquinone or methoquinone as a polymerization inhibitor were employed, or in the case of Example 7 where only the oxime ester-based polymerization initiator was employed as a polymerization initiator, it was possible to obtain a photosensitive coloring composition wherein the γ (contrast) of the exposure sensitivity curve of the photosensitive coloring composition was 1.33 or more and the exposure sensitivity properties thereof were such that they were not sensitive to such a small exposure dose that was not more than 23% of the minimum exposure dose that makes the residual rate of the film not lower than 85% after development. It was also confirmed that, as long as these conditions were satisfied, it was possible to form through-holes each having a diameter not larger than 10 μm and being excellent in configuration of pattern and in accuracy.

Whereas, in the cases of Comparative Examples 1 and 2, it was impossible to obtain a photosensitive coloring composition wherein the γ was 1.33 or more and the exposure sensitivity properties thereof were such that they were not sensitive to such a small exposure dose that was not more than 23% of the minimum exposure dose that makes the residual rate of the film not lower than 85% after development. For this reason, it was difficult to form a through-hole having a diameter not larger than 10 μm.

What is claimed is:

1. A method of manufacturing a color filter substrate for a semitransmissive type liquid crystal display device, comprising:
    forming a photosensitive coloring composition layer containing a photo-polymerizable monomer, a resinous binder, an oxime ester-based polymerization initiator, a coloring agent and a solvent on a surface of a transparent substrate, said surface being partitioned into a large number of pixel regions;
    exposing the photosensitive coloring composition layer to light; and
    developing the photosensitive coloring composition layer to form a transmissive portion and a reflective portion, said transmissive portion being assigned to colorize a transmitted light from a light source arranged on a rear surface side of a liquid crystal display device, said reflective portion being assigned to colorize a reflected light to be derived from reflection of an external light entering from the observer's side and having a through-hole with a diameter of 10 μm or less,
    wherein the photosensitive coloring composition contains a polymerization inhibitor represented by the following chemical formula (1) and an organic pigment, and has an exposure sensitivity property in which contrast γ (=tan θ) is confined to 1.33 or more and a residual rate of a film of the photosensitive coloring composition after development is 0% at an exposure dose of not more than 23% of the minimum exposure dose that makes the residual rate of the film not lower than 85%, when a rising angle of an exposure sensitivity curve is defined as θ in the exposure sensitivity curve to be derived by plotting exposure sensitivity in coordinates with an abscissa thereof representing common logarithm of the exposure dose and with an ordinate thereof representing the residual rate of the film after development

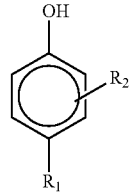

[formula (1)]

where $R_1$ is hydroxyl group or alkoxy group, and $R_2$ is $C_nH_{2n+1}$ (n=0-4).

2. The method according to claim 1, wherein the polymerization inhibitor represented by formula (I) is hydroquinone or methoquinone and is contained at a ratio of 0.001-0.05% by weight based on a total weight of solid matter of the photosensitive coloring composition.

3. The method according to claim 1, wherein the oxime ester-based polymerization initiator is selected from the group consisting of 1,2-octane dione, 1-[4-(phenylthio)-2-(O-benzoyl oxime)], and O-(acetyl)-N-(1-phenyl-2-oxo-2-(4'-methoxy-naphthyl)ethylidene)hydroxylamine.

4. The method according to claim 1, further comprising:
    measuring the contrast γ(=tan θ) and the residual rate; and
    based on the measuring, determining that the contrast γ(=tan θ) is confined to 1.33 or more and that the residual rate of the film of the photosensitive coloring composition after development is 0% at an exposure dose of not more than 23% of the minimum exposure dose that makes the residual rate of the film not lower than 85%, when a rising angle of an exposure sensitivity curve is defined as θ in the exposure sensitivity curve to be derived by plotting exposure sensitivity in coordinates with an abscissa thereof representing common logarithm of the exposure dose and with an ordinate thereof representing the residual rate of the film after development.

5. A method of manufacturing a color filter substrate for a semitransmissive type liquid crystal display device, comprising:
    forming a photosensitive coloring composition layer containing a photo-polymerizable monomer, a resinous binder, a polymerization initiator, a coloring agent and a solvent on a surface of a transparent substrate, said surface being partitioned into a large number of pixel regions;

exposing the photosensitive coloring composition layer to light; and developing the photosensitive coloring composition layer to form a transmissive portion and a reflective portion, said transmissive portion being assigned to colorize a transmitted light from a light source arranged on a rear surface side of a liquid crystal display device, said reflective portion being assigned to colorize a reflected light to be derived from reflection of an external light entering from the observer's side and having a through-hole with a diameter of 10 μm or less, wherein the photosensitive coloring composition contains a polymerization inhibitor represented by the following chemical formula (I) and an organic pigment, and has an exposure sensitivity property in which contrast $\gamma(=\tan\theta)$ is confined to 1.33 or more and a residual rate of a film of the photosensitive coloring composition after development is 0% at an exposure dose of not more than 23% of the minimum exposure dose that makes the residual rate of the film not lower than 85%, when a rising angle of an exposure sensitivity curve is defined as $\theta$ in the exposure sensitivity curve to be derived by plotting exposure sensitivity in coordinates with an abscissa thereof representing common logarithm of the exposure dose and with an ordinate thereof representing the residual rate of the film after development

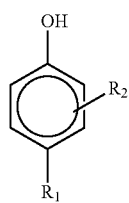

[formula (1)]

where $R_1$ is hydroxyl group or alkoxy group, and $R_2$ is $C_nH_{2n+1}$ (n=0-4), and the polymerization initiator is formed of a combination of an oxime ester-based polymerization initiator with at least one kind of other polymerization initiator selected from the group consisting of an acetophenone-based compound, a benzoin-based compound, a benzophenone-based compound, a thioxanthone-based compound, a triazine-based compound, a phosphine-based compound, a quinone-based compound, a borate-based compound, a carbazole-based compound, an imidazole-based compound, and a titanocene-based compound.

6. A method of manufacturing a color filter substrate for a semitransmissive type liquid crystal display device, comprising:

forming a photosensitive coloring composition layer containing a photo-polymerizable monomer, a resinous binder, a polymerization initiator, a coloring agent and a solvent on a surface of a transparent substrate, said surface being partitioned into a large number of pixel regions;

exposing the photosensitive coloring composition layer to light;

developing the photosensitive coloring composition layer to form a transmissive portion and a reflective portion, said transmissive portion being assigned to colorize a transmitted light from a light source arranged on a rear surface side of a liquid crystal display device, said reflective portion being assigned to colorize a reflected light to be derived from reflection of an external light entering from the observer's side and having a through-hole with a diameter of 10 μm or less, wherein the photosensitive coloring composition contains a polymerization inhibitor represented by the following chemical formula (1) and an organic pigment, and has an exposure sensitivity property in which contrast $\gamma(=\tan\theta)$ is confined to 1.33 or more and a residual rate of a film of the photosensitive coloring composition after development is 0% at an exposure dose of not more than 23% of the minimum exposure dose that makes the residual rate of the film not lower than 85%, when a rising angle of an exposure sensitivity curve is defined as $\theta$ in the exposure sensitivity curve to be derived by plotting exposure sensitivity in coordinates with an abscissa thereof representing common logarithm of the exposure dose and with an ordinate thereof representing the residual rate of the film after development

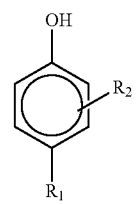

[formula (1)]

where $R_1$ is hydroxyl group or alkoxy group, and $R_2$ is $C_nH_{2n+1}$ (n=0-4);

measuring the contrast $\gamma(=\tan\theta)$ and the residual rate; and based on the measuring, determining that the contrast $\gamma(=\tan\theta)$ is confined to 1.33 or more and that the residual rate of the film of the photosensitive coloring composition after development is 0% at an exposure dose of not more than 23% of the minimum exposure dose that makes the residual rate of the film not lower than 85%, when a rising angle of an exposure sensitivity curve is defined as $\theta$ in the exposure sensitivity curve to be derived by plotting exposure sensitivity in coordinates with an abscissa thereof representing common logarithm of the exposure dose and with an ordinate thereof representing the residual rate of the film after development.

* * * * *

UNITED STATES PATENT AND TRADEMARK OFFICE
CERTIFICATE OF CORRECTION

PATENT NO. : 8,642,233 B2  Page 1 of 1
APPLICATION NO. : 13/337973
DATED : February 4, 2014
INVENTOR(S) : Shimizu et al.

It is certified that error appears in the above-identified patent and that said Letters Patent is hereby corrected as shown below:

In the Claims

Column 22, Line 13 (Approx.), In Claim 1, delete "0" and insert -- $\theta$ --, therefor.
Column 22, Line 34 (Approx.), In Claim 2, delete "(I)" and insert -- (1) --, therefor.
Column 23, Line 14, In Claim 5, delete "(I)" and insert -- (1) --, therefor.
Column 23, Line 22, In Claim 5, delete "6" and insert -- $\theta$ --, therefor.
Column 24, Line 23, In Claim 6, delete "6" and insert -- $\theta$ --, therefor.

Signed and Sealed this
Twenty-second Day of July, 2014

Michelle K. Lee
*Deputy Director of the United States Patent and Trademark Office*